US010819355B1

(12) United States Patent
Abughazaleh et al.

(10) Patent No.: US 10,819,355 B1
(45) Date of Patent: Oct. 27, 2020

(54) PHASE TO DIGITAL CONVERTER

(71) Applicant: NXP USA, Inc., Austin, TX (US)

(72) Inventors: Firas N. Abughazaleh, Austin, TX (US); David Bearden, Austin, TX (US); James Andrew Welker, Leander, TX (US); Huy Nguyen, Austin, TX (US); Venkatarama Mohanareddy Mooraka, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/580,117

(22) Filed: Sep. 24, 2019

(51) Int. Cl.
| H03L 7/00 | (2006.01) |
| H03L 7/099 | (2006.01) |
| H03L 7/085 | (2006.01) |

(52) U.S. Cl.
CPC ............ H03L 7/0992 (2013.01); H03L 7/085 (2013.01); H03L 7/0995 (2013.01)

(58) Field of Classification Search
CPC ...... H03L 7/0992; H03L 7/0995; H03L 7/085
USPC .......................................................... 327/291
See application file for complete search history.

(56) References Cited

U.S. PATENT DOCUMENTS

| 5,128,624 | A | * | 7/1992 | Hoshino | ................ | G01R 25/08 |
| | | | | | | 327/12 |
| 5,416,444 | A | * | 5/1995 | Yamauchi | ............... | G01R 25/08 |
| | | | | | | 324/76.82 |
| 5,818,797 | A | * | 10/1998 | Watanabe | ................ | G04F 10/00 |
| | | | | | | 368/113 |
| 6,771,202 | B2 | * | 8/2004 | Watanabe | ............. | G04F 10/005 |
| | | | | | | 341/118 |
| 7,501,973 | B2 | | 3/2009 | Choi et al. | | |
| 7,583,152 | B2 | | 9/2009 | Zhang | | |
| 7,629,915 | B2 | | 12/2009 | Lin | | |

(Continued)

OTHER PUBLICATIONS

Hsu, Chun-Ming et al.; Member, IEEE; "A Low-Noise Wide-BW 3.6-GHz Digital Delta-Sigma Fractional-n Frequency Synthesizer with a Noise-Shaping Time-to-Digital Converter and Quantization Noise Cancellation"; IEEE Journal of Solid-State Circuits; vol. 43, No. 12; Dec. 2008; pp. 2776-2786 (11 pages).

(Continued)

*Primary Examiner* — Ryan Jager

(57) ABSTRACT

A phase to digital converter (PDC) generates a digital output that represents a phase difference between first and second clocks. The PDC includes a gated ring oscillator (GRO), which includes N signal delay elements coupled together in a ring via a logic gate, wherein a 1st signal delay element of the ring comprises an input coupled to an output of the logic gate, and wherein a Nth signal delay element of the ring comprises an output coupled to a first input of the logic gate. A convertor is coupled to the GRO and configured to generate low order bits of the digital output based on outputs of the logic gate and the N signal delay elements. A first counter includes an input coupled to an output of one of the N signal delay elements or the logic gate, wherein the first counter is configured to generate a first digital counter value. A second counter includes an input coupled to an output of another one of the N signal delay elements or the logic gate, wherein the second counter is configured to generate a second digital counter value. The PDC generates the digital output signal based on the low order bits and one of the first and second digital counter values.

18 Claims, 13 Drawing Sheets

(56) References Cited

U.S. PATENT DOCUMENTS

| | | |
|---|---|---|
| 8,022,849 B2 | 9/2011 | Zhang et al. |
| 8,076,960 B2 | 12/2011 | Geng et al. |
| 8,390,347 B1 * | 3/2013 | Sinha ................... H03L 7/085 |
| | | 327/147 |
| 8,581,759 B2 | 11/2013 | Booth et al. |
| 8,791,734 B1 | 7/2014 | Hara et al. |
| 9,041,443 B2 | 5/2015 | Jang et al. |
| 9,971,312 B1 * | 5/2018 | Hailu ................. G01R 29/023 |
| 9,998,126 B1 * | 6/2018 | Hailu ................... H03L 7/085 |
| 10,355,702 B2 * | 7/2019 | Gao ........................ H03L 7/18 |
| 2016/0041529 A1 * | 2/2016 | Yamauchi ............ G04F 10/005 |
| | | 702/176 |

OTHER PUBLICATIONS

Sinha, Anand Kumar et al.; "Time/Phase to Digital Converter"; Freescale Semiconductor India Pvt. Ltd.; 2006; 15 pages.

Staszewski, Robert Bogdan et al., "Time to Digital Converter for RF Frequency Synthesis in 90 nm CMOS"; IEEE Radio Frequency Integrated Circuits Symposium; 2005; pp. 473-476 (4 pages).

Wu, Bo et al.; "A 9-bit 215 MS/s Folding-Flash Time-to-Digital Converter Based on Redundant Remainder Number System in 45-nm CMOS"; IEEE Journal of Solid-State Circuits; 2018; pp. 1-11.

Yao, Chih-Wei; Member, IEEE. "A 2.8-3.2-GHz Fractional-N Digital PLL With ADS-Assisted TDC and Inductively Coupled Fine-Tuning DCO"; IEEE Journal of Solid-State Circuits; vol. 48, No. 3; Mar. 2013; pp. 698-710 (13 pages).

\* cited by examiner

Thermometric to Binary Conversion Table

| | | | | | | | Input | | | | | | | | | Output | | |
|---|---|---|---|---|---|---|---|---|---|---|---|---|---|---|---|---|---|---|
| Q0 | Q1 | Q2 | Q3 | Q4 | Q5 | Q6 | Q7 | Q8 | Q9 | Q10 | Q11 | Q12 | Q13 | Q1 | Q15 | BTD_Lower | | |
| 1 | 1 | 1 | 1 | 1 | 1 | 1 | 1 | 1 | 1 | 1 | 1 | 1 | 1 | 1 | 1 | 00000 | 0 | |
| 0 | 1 | 1 | 1 | 1 | 1 | 1 | 1 | 1 | 1 | 1 | 1 | 1 | 1 | 1 | 1 | 00001 | 1 | |
| 0 | 0 | 1 | 1 | 1 | 1 | 1 | 1 | 1 | 1 | 1 | 1 | 1 | 1 | 1 | 1 | 00010 | 2 | |
| 0 | 0 | 0 | 1 | 1 | 1 | 1 | 1 | 1 | 1 | 1 | 1 | 1 | 1 | 1 | 1 | 00011 | 3 | |
| 0 | 0 | 0 | 0 | 1 | 1 | 1 | 1 | 1 | 1 | 1 | 1 | 1 | 1 | 1 | 1 | 00100 | 4 | |
| 0 | 0 | 0 | 0 | 0 | 1 | 1 | 1 | 1 | 1 | 1 | 1 | 1 | 1 | 1 | 1 | 00101 | 5 | |
| 0 | 0 | 0 | 0 | 0 | 0 | 1 | 1 | 1 | 1 | 1 | 1 | 1 | 1 | 1 | 1 | 00110 | 6 | |
| 0 | 0 | 0 | 0 | 0 | 0 | 0 | 1 | 1 | 1 | 1 | 1 | 1 | 1 | 1 | 1 | 00111 | 7 | 1st Half GRO Cylcle |
| 0 | 0 | 0 | 0 | 0 | 0 | 0 | 0 | 1 | 1 | 1 | 1 | 1 | 1 | 1 | 1 | 01000 | 8 | |
| 0 | 0 | 0 | 0 | 0 | 0 | 0 | 0 | 0 | 1 | 1 | 1 | 1 | 1 | 1 | 1 | 01001 | 9 | |
| 0 | 0 | 0 | 0 | 0 | 0 | 0 | 0 | 0 | 0 | 1 | 1 | 1 | 1 | 1 | 1 | 01010 | 10 | |
| 0 | 0 | 0 | 0 | 0 | 0 | 0 | 0 | 0 | 0 | 0 | 1 | 1 | 1 | 1 | 1 | 01011 | 11 | |
| 0 | 0 | 0 | 0 | 0 | 0 | 0 | 0 | 0 | 0 | 0 | 0 | 1 | 1 | 1 | 1 | 01100 | 12 | |
| 0 | 0 | 0 | 0 | 0 | 0 | 0 | 0 | 0 | 0 | 0 | 0 | 0 | 1 | 1 | 1 | 01101 | 13 | |
| 0 | 0 | 0 | 0 | 0 | 0 | 0 | 0 | 0 | 0 | 0 | 0 | 0 | 0 | 1 | 1 | 01110 | 14 | |
| 0 | 0 | 0 | 0 | 0 | 0 | 0 | 0 | 0 | 0 | 0 | 0 | 0 | 0 | 0 | 1 | 01111 | 15 | Full GRO Cylcle |
| 0 | 0 | 0 | 0 | 0 | 0 | 0 | 0 | 0 | 0 | 0 | 0 | 0 | 0 | 0 | 0 | 10000 | 16 | |
| 1 | 0 | 0 | 0 | 0 | 0 | 0 | 0 | 0 | 0 | 0 | 0 | 0 | 0 | 0 | 0 | 10001 | 17 | |
| 1 | 1 | 0 | 0 | 0 | 0 | 0 | 0 | 0 | 0 | 0 | 0 | 0 | 0 | 0 | 0 | 10010 | 18 | |
| 1 | 1 | 1 | 0 | 0 | 0 | 0 | 0 | 0 | 0 | 0 | 0 | 0 | 0 | 0 | 0 | 10011 | 19 | |
| 1 | 1 | 1 | 1 | 0 | 0 | 0 | 0 | 0 | 0 | 0 | 0 | 0 | 0 | 0 | 0 | 10100 | 20 | |
| 1 | 1 | 1 | 1 | 1 | 0 | 0 | 0 | 0 | 0 | 0 | 0 | 0 | 0 | 0 | 0 | 10101 | 21 | |
| 1 | 1 | 1 | 1 | 1 | 1 | 0 | 0 | 0 | 0 | 0 | 0 | 0 | 0 | 0 | 0 | 10110 | 22 | 2nd Half GRO Cylcle |
| 1 | 1 | 1 | 1 | 1 | 1 | 1 | 0 | 0 | 0 | 0 | 0 | 0 | 0 | 0 | 0 | 10111 | 23 | |
| 1 | 1 | 1 | 1 | 1 | 1 | 1 | 1 | 0 | 0 | 0 | 0 | 0 | 0 | 0 | 0 | 11000 | 24 | |
| 1 | 1 | 1 | 1 | 1 | 1 | 1 | 1 | 1 | 0 | 0 | 0 | 0 | 0 | 0 | 0 | 11001 | 25 | |
| 1 | 1 | 1 | 1 | 1 | 1 | 1 | 1 | 1 | 1 | 0 | 0 | 0 | 0 | 0 | 0 | 11010 | 26 | |
| 1 | 1 | 1 | 1 | 1 | 1 | 1 | 1 | 1 | 1 | 1 | 0 | 0 | 0 | 0 | 0 | 11011 | 27 | |
| 1 | 1 | 1 | 1 | 1 | 1 | 1 | 1 | 1 | 1 | 1 | 1 | 0 | 0 | 0 | 0 | 11100 | 28 | |
| 1 | 1 | 1 | 1 | 1 | 1 | 1 | 1 | 1 | 1 | 1 | 1 | 1 | 0 | 0 | 0 | 11101 | 29 | |
| 1 | 1 | 1 | 1 | 1 | 1 | 1 | 1 | 1 | 1 | 1 | 1 | 1 | 1 | 0 | 0 | 11110 | 30 | |
| 1 | 1 | 1 | 1 | 1 | 1 | 1 | 1 | 1 | 1 | 1 | 1 | 1 | 1 | 1 | 0 | 11111 | 31 | |

Fig. 6

BTD_Lower: 0-7 -> BTD_Upper_1

US 10,819,355 B1

PHASE TO DIGITAL CONVERTER

BACKGROUND

A phase-to-digital convertor, as its name implies, converts a phase difference between clock signals into a digital representation. Phase-to-digital convertors are employed in digital phase locked loops (PLL), which are electronic systems that generate an output clock with a frequency that is a multiple of the frequency of an externally provided reference clock. PLLs are typically used for computer clock synchronization, demodulation, frequency synthesis, etc.

A typical PLL contains a phase frequency detector (PFD), a controlled oscillator and a feedback path that includes a feedback divider. The PFD receives two clock inputs; a feedback clock from the feedback divider, and a reference clock. A clock has two edges, a leading or rising edge at the start of the clock period and a negative or edge that marks the end of a half clock period. PFDs detect a phase difference or time delay between rising edges of the reference and feedback clocks. The phase difference, depending on whether it is positive, negative, or zero, determines whether the controlled oscillator increases, decreases, or maintains the frequency $f_{out}$ of the output clock it generates. The feedback divider is positioned in the feedback path between the controlled oscillator and the PFD. The feedback divider, also called a clock divider, receives the output clock, and generates the feedback clock with frequency $f_{fb}=f_{out}/Nfb$ where Nfb is often an integer. If the phase of the reference and feedback clocks are kept in lock step, the reference and feedback clock frequencies should be the same.

Digital PLLs are replacing analog PLLs in many applications. Digital PLLs often employ phase-to-digital convertors, which in turn employ time-to-digital convertor subsystems that convert a phase difference between reference and feedback clocks into a digital representation. Unfortunately, time-to-digital convertors can present new challenges to accurate operation of systems, including digital PLLs, in which they are employed.

BRIEF DESCRIPTION OF THE DRAWINGS

The present technology may be better understood, and its numerous objects, features, and advantages made apparent to those skilled in the art by referencing the accompanying drawings.

FIG. 6 is a table that shows the outputs of an example thermometric-to-binary converter for respective inputs.

The use of the same reference symbols in different drawings indicates similar or identical items.

DETAILED DESCRIPTION

Phase-to-digital convertors generate a digital signal that is proportional to a phase difference between a pair of clock signals. The accuracy of a phase-to-digital convertor can be subject to unexpectedly short or unexpectedly long signal transmission delay within the converter. Disclosed is a phase-to-digital convertor whose accuracy is less sensitive to signal transmission delay. The phase-to-digital convertor of the present disclosure employs a time-to-digital convertor, which includes a subsystem (referred to as the "stopwatch system") that includes an oscillator and at least two counters. The oscillator generates a periodic signal when activated by the rising edge of a first clock. The counters increment their respective counter values at different points during each cycle of the oscillator's periodic signal. When the oscillator is deactivated by the rising edge of a second clock, the phase-to-digital convertor selects one of the counter values based on the point during the last periodic cycle when the oscillator was deactivated. The phase-to-digital convertor uses the selected counter value to generate a digital representation of a phase difference between the first and second clocks. The phase-to-digital convertor of the present disclosure will be described with reference to use within a PLL, it being understood the present disclosure should not be limited thereto.

Figure 1:
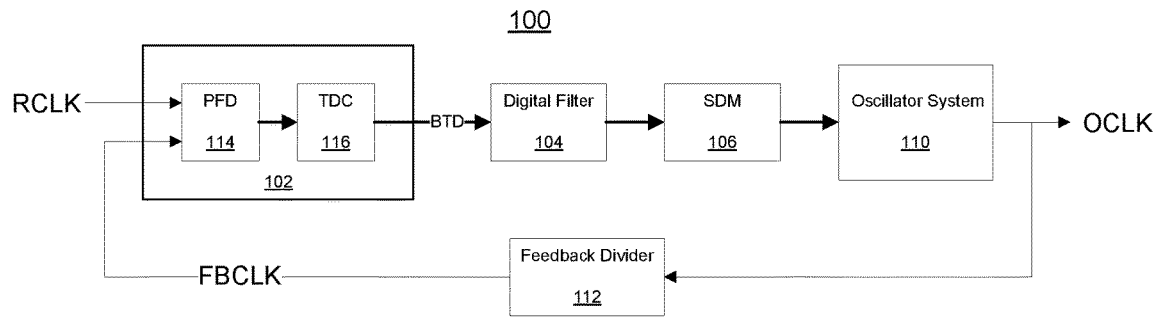
FIG. 1 is a block diagram of a PLL that includes a phase-to-digital converter.

As noted above, the accuracy of phase-to-digital convertors can be sensitive to signal transmission delay. FIGS. 1-8 illustrate this problem in greater detail. FIG. 1 is a block diagram of a simple PLL 100 that includes a phase-to-digital convertor (PDC) 102. PLL 100 generates an output clock OCLK that tracks an externally provided reference clock RCLK. PDC 102 receives and compares the rising edges of the reference clock RCLK and a feedback clock FBCLK output of feedback divider 112. PDC 102 generates a multi-bit digital value indicative of a phase difference or time delay between the two input clocks. The multi-bit digital value will be referred to herein as the binary time delay (BTD) value.

Digital filter 104, which in one embodiment is a narrow-band device, filters BTD, the result of which is subsequently processed by sigma delta modulator (SDM) 106. A controlled oscillator system 110 generates an output clock OCLK, the frequency $f_{out}$ of which depends on the output of SDM 106. The output clock OCLK is provided to feedback divider 112, which in turn provides feedback clock FBCLK to PDC 102 with frequency $f_{fb}=f_{out}/\text{Nfb}$.

PDC 102 includes a phase frequency detector (PFD) 114 and time-to-digital converter (TDC) 116. PFD 114 detects the phase or time delay between the reference clock RCLK and the feedback clock FBCLK. PFD 114 also determines whether the reference clock RCLK is leading or lagging. TDC 116 translates this information into the multibit BTD value that represents the magnitude and sign (e.g., leading or lagging) of the phase difference.

Figure 2:
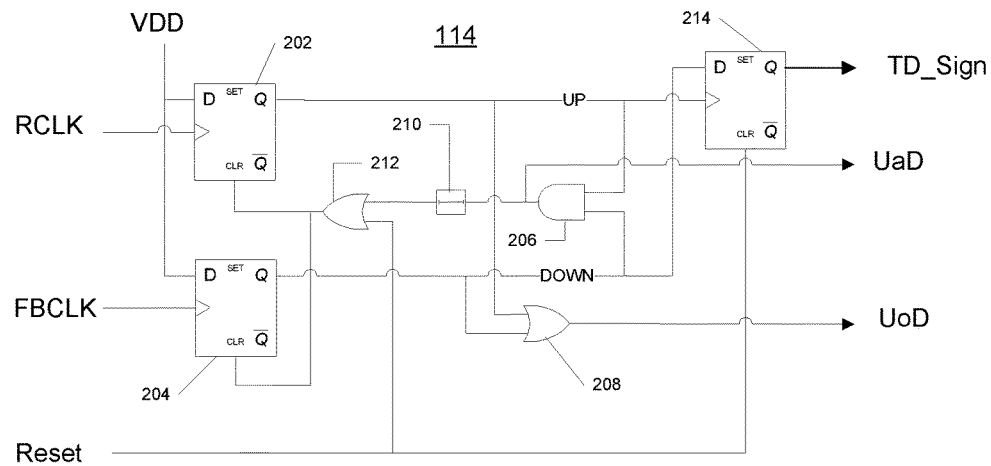
FIG. 2 is a schematic diagram illustrating an example phase-frequency detector employed in the PLL of FIG. 1.

An example PFD 114 is shown in the schematic diagram of FIG. 2. PFD 114 includes a pair of input D flip-flops 202 and 204. Flip-flop 202 receives reference clock RCLK at its clock input, and flip-flop 204 receives feedback clock FBCLK at its clock input. The D inputs of flip-flops 202 and 204 are connected to supply voltage VDD. The Q output of D flip-flop 202 is designated as the up signal UP, while the Q output of D flip-flop 204 is designated as the down signal DOWN. After flip-flops 202 and 204 are reset, the UP and DOWN outputs transition to a high voltage level with the rising edges of RCLK and FBCLK, respectively. Both UP and DOWN signals are input to AND gate 206 and OR gate 208 as shown. The output of AND gate 206 is designated as the up and down signal UaD, while the output of OR gate 208 is designated as the up or down signal UoD. The clear-inputs of D flip-flops 202 and 204 receive the UaD output of AND gate 206 via signal delay 210 and OR gate 212, which also receives the Reset signal. Accordingly, the UP and DOWN outputs of D flip-flops 202 and 204 are cleared to low when UaD or Reset goes high. Finally, as shown in FIG. 2 the clock input of D flip-flop 214 receives the UP signal, and the D input of flip D flip-flop 214 receives the DOWN signal. If feedback clock FBCLK leads reference clock RCLK, the output of flip-flop 214, which is designated as TD_Sign, will go high, and vice versa. Like flip flops 202 and 204, flip-flop 214 is cleared by Reset, which can be asserted between cycles of the reference clock RCLK.

Figure 3:
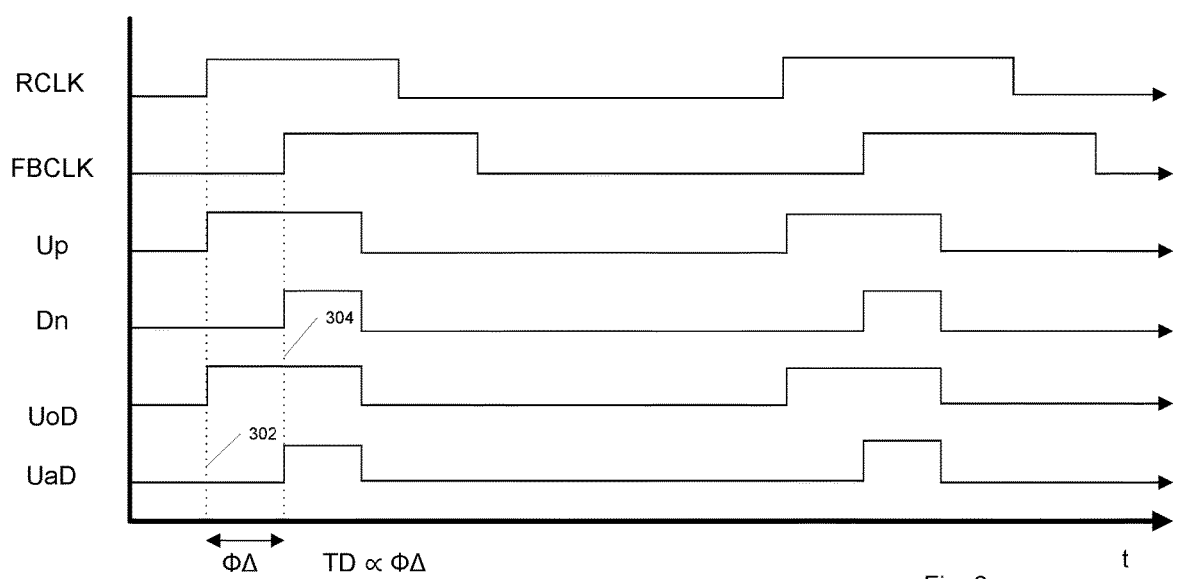
FIG. 3 is a timing diagram illustrating operational aspects of the phase-frequency detector.

The operation of PFD 114 can best be understood with reference to the timing diagram shown within FIG. 3, which shows reference clock RCLK leading feedback clock FBCLK by phase difference ΦΔ. The UP signal output of flip-flop 202 transitions to high at the leading edge 302 of reference clock RCLK. This in turn causes the UoD output of OR gate 208 to go high. Although not shown in FIG. 3, TD_Sign output of flip-flop 214 stays low at the transition of the UP signal, thus indicating that reference clock RCLK leads the feedback clock FBCLK. The DOWN signal output of flip-flop 204 transitions to high at the leading edge 304 of feedback clock FBCLK. With both UP and DOWN asserted high, UaD goes high. ΦΔ is represented by the time difference between UoD and UaD as shown. After a delay introduced by delay element 210 (and to a lesser extent by OR gate 212), asserted UaD causes the UP and DOWN outputs of flip-flops 202 and 204, respectively, to go low at substantially the same point in time. This in turn causes both the UoD and UaD outputs of OR gate 208 and AND gate 206, respectively, to go low.

With continuing reference to FIGS. 1-3, FIG. 4 illustrates TDC 116, which generates a multibit binary time delay BTD value that represents the phase difference ΦΔ between reference clock RCLK and feedback clock FBCLK. As will be more fully described, BTD is generated by concatenating three values; TD_Sign, BTD_Upper, and BTD_Lower.

TDC 116 includes an example gated ring oscillator (GRO), which in turn includes signal delay elements 402 connected in a ring as shown via NAND gate 404. The delay elements 402 take form in noninverting buffers, it being understood alternative delay elements are contemplated. The output of buffer 402-15 is fed back to the input of NAND gate 404 via feedback path 406. NAND gate 404 also receives UoD from PFD 114 (not shown in FIG. 4). The outputs of NAND gate 404 and buffers 402, which are designated as nodes N0-N15 of the GRO, are at a high voltage level prior to GRO activation.

The GRO is activated when UoD goes high. When activated, the GRO repeats a cycle. FIG. 5 illustrates the states of nodes N0-N15 shown in FIG. 4 as the GRO undergoes a cycle. The GRO cycle consists of a first half cycle followed by a second half cycle as shown in FIG. 5.

Figure 4:
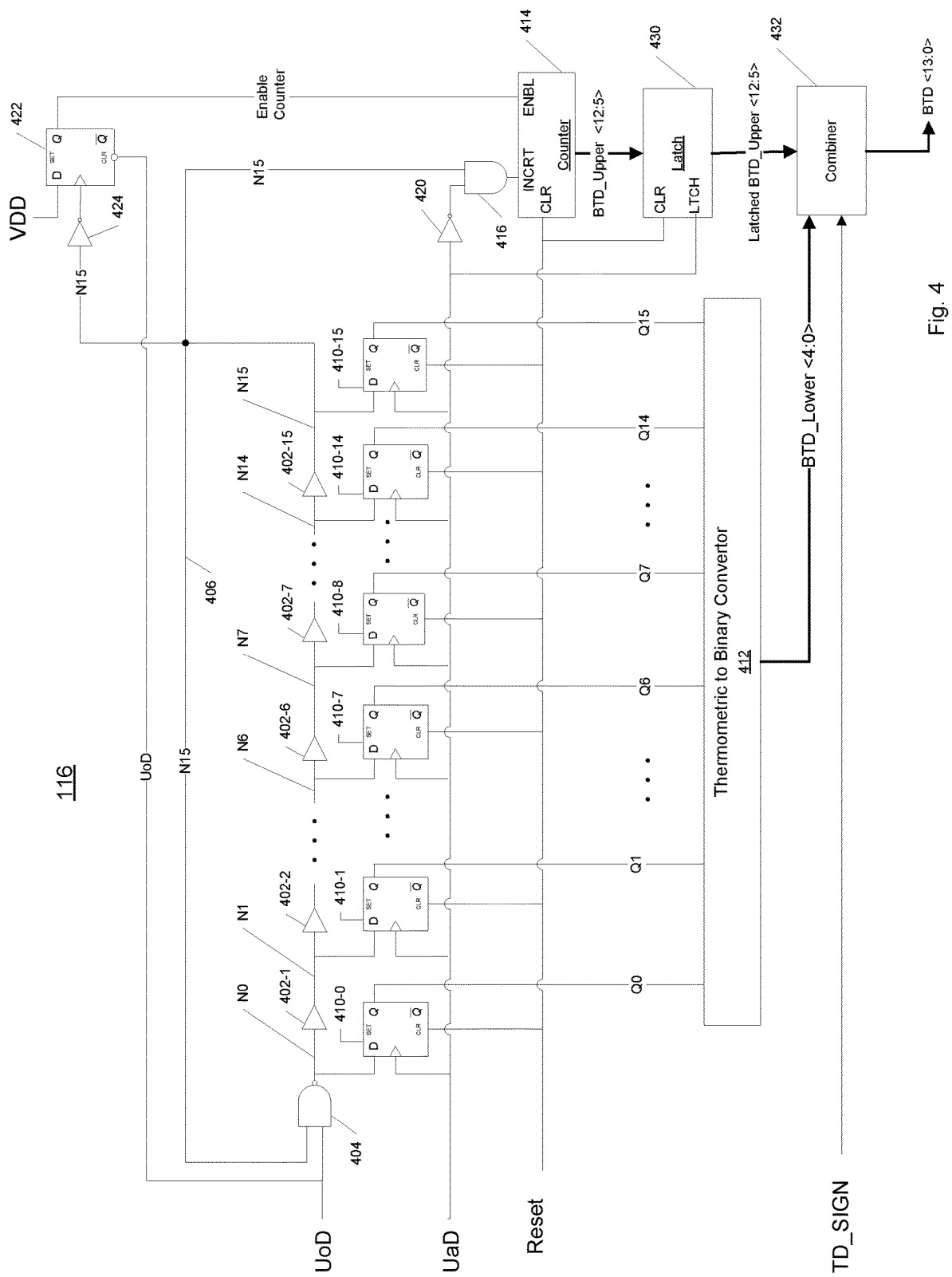
FIG. 4 is a diagram illustrating an example time-to-digital converter employed in PLL of FIG. 1.
Figure 5:
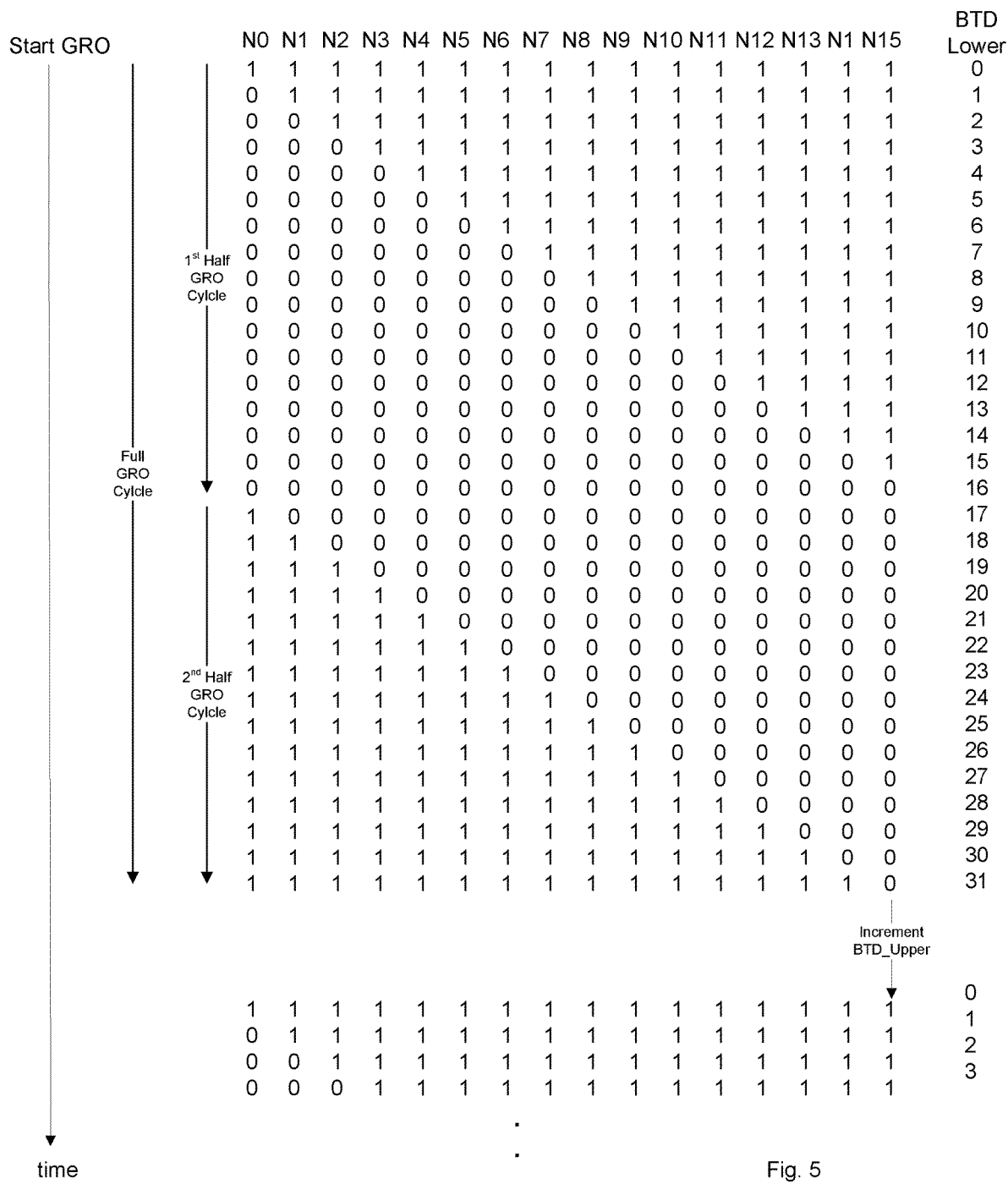
FIG. 5 illustrates the states of nodes of the oscillator shown in FIG. 4 during a cycle thereof.

With continuing reference to FIGS. 4 and 5, when UoD transitions to high, node N0 goes low, and this low voltage level propagates sequentially through buffers 402 during the first half of the GRO cycle, which ends when all of nodes N0-N15 are low. And the second half of the GRO cycle starts after node N15 transitions to low. Because the output of buffer 402-15 is fed back to an input of NAND gate 404, node N0 goes high in response to N15 going low. And this high level propagates sequentially through buffers 402. The GRO cycle ends, and the next begins after the output (i.e., node N15) of buffer 402-15 transitions back to high. It is noted the GRO cycle repeats while UoD is high.

TDC 116 includes D flip-flops 410 that capture the state of the GRO immediately when the GRO is deactivated. In other words, flip-flops 410-0-410-15 capture the voltage levels at nodes N0-N15, respectively, when UaD transitions from low to high. The Q outputs of flip-flops 410-0-410-15 are collectively provided as an input to thermometric-to-binary converter (TBC) 412 for translation into BTD_Lower. The table of FIG. 6 maps BTD_Lower outputs to respective sets of Q inputs for TBC 412. FIG. 6 shows that BTD_Lower increases sequentially from 0 to 15 during the first half of the GRO cycle, and increases sequentially from 16 to 31 during the second half of the GRO cycle.

Counter 414 is configured to count the number of completed GRO cycles. Counter 414 includes several inputs including INCRT, ENBL and CLR, which receive the output of AND gate 416, the output of flip-flop 422, and the Reset signal, respectively. AND gate 416 receives the output of buffer 402-15 and the output of inverter 420, which in turn receives UaD. Counter 414 must be enabled before it begins counting. ENBL of counter 414 is coupled to the output of flip-flop 422. The D input of flip-flop 422 is coupled to supply voltage VDD, and the clock input of flip-flop 422 is connected to the output of the inverter 424, which in turn receives the output of buffer 402-15. Counter 414 is enabled when the output of buffer 402-15 first transitions from high to low, which occurs at end of the first half of the initial GRO cycle as noted above. Counter 414, when enabled, will increment its counter value BTD_Upper each time N15 transitions from low to high (i.e., at the end of each second half cycle) until UaD is asserted high. Counter 414 will clear BTD_Upper when Reset is asserted high.

TDC 116 includes a latch 430 that latches the value of BTD_Upper when the GRO is deactivated. Latch 430 includes separate inputs CLR and LTCH. The latch input LTCH receives UaD. Accordingly, latch 430 latches the BTD_Upper value of counter 414 when UaD goes high. Latch 430 will clear its stored content when Reset is asserted high.

Combiner 432, as its name implies, combines or concatenates the time delay signal TD_Sign, the latched BTD_Upper value provided by the latch 430, and the BTD_Lower value provided by TBC 412, to create BTD. In other words, combiner 432 generates BTD=TD_Sign‖BTD_Upper‖BTD_Lower.

Figure 7:
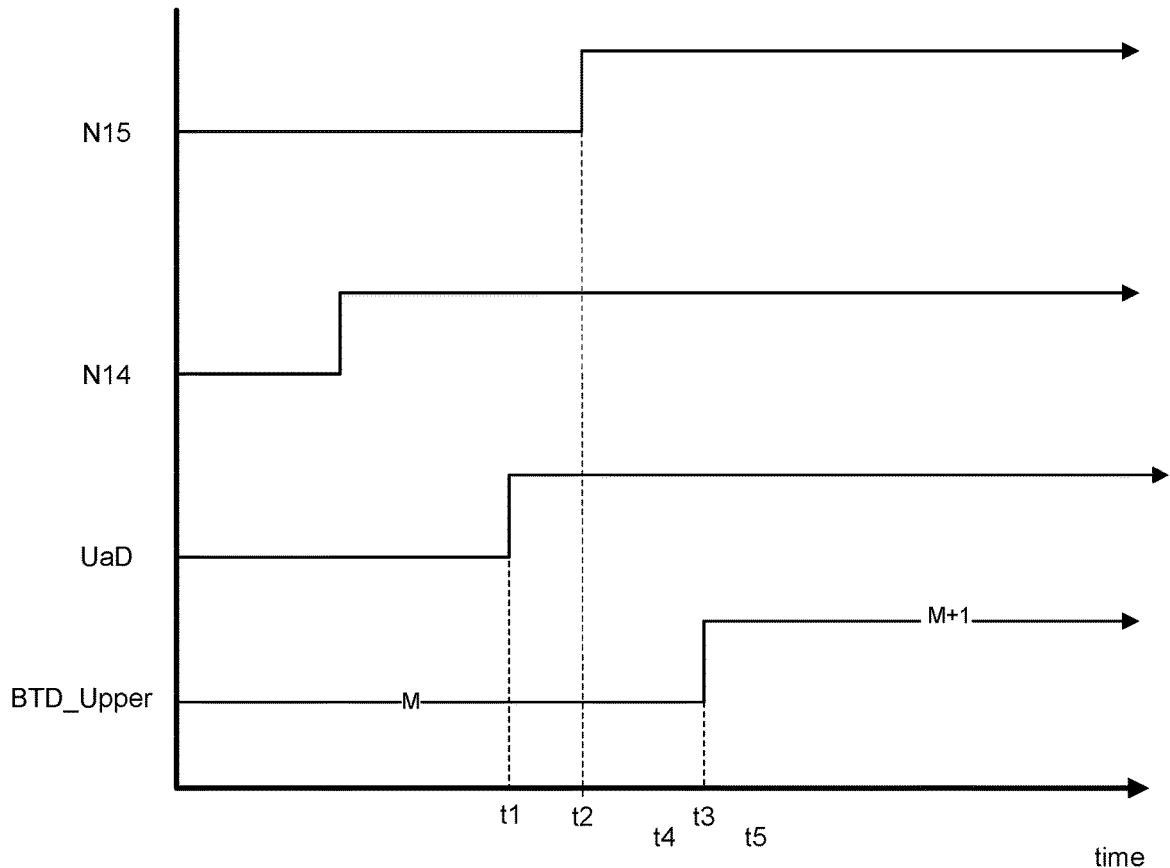
FIG. 7 is a timing diagram illustrating adverse effects of time delay to the operation of the time-to-digital converter shown in FIG. 4.
Figure 7:
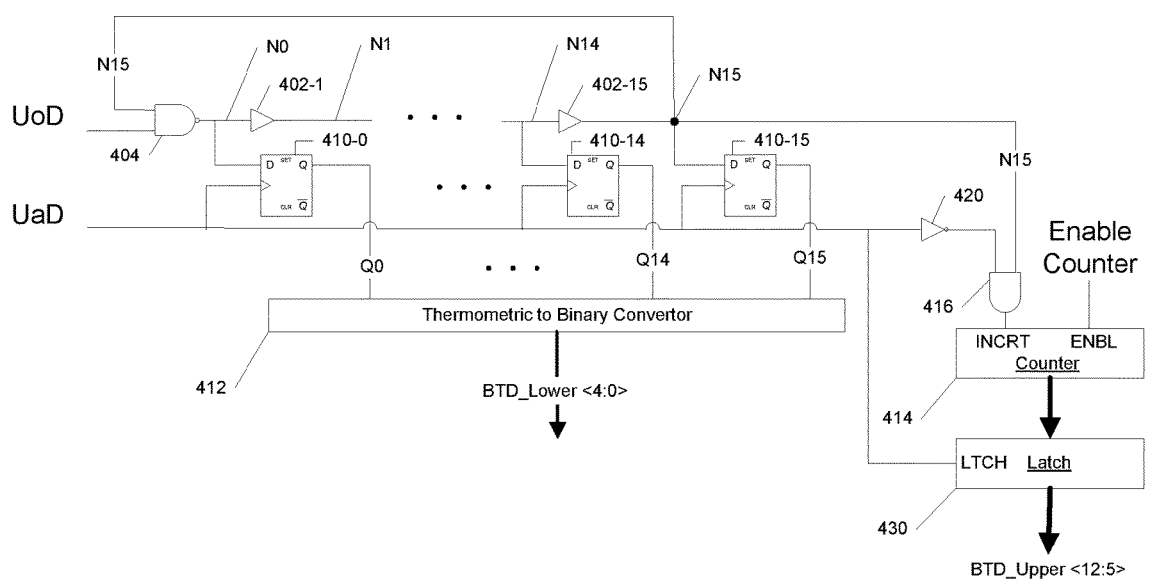

Most of the time the BTD value output of TDC 116 is a substantially accurate digital representation of the phase delay (DA. Unfortunately, under some circumstances TDC 116 may generate a less than accurate BTD value. For example, TDC 116 may not produce an accurate BTD when the GRO is deactivated (i.e., when UaD transitions to high) near the end of a GRO cycle. To illustrate, FIG. 7 illustrates a timing diagram that shows oscillator signals near the end of a GRO cycle. In particular the figure shows: the state at nodes N14 and N15, which correspond to the outputs of buffers 402-14 and 402-15, respectively; UaD, and; the value of BTD_Upper of counter 414. For convenience, relevant components of the TDC 116 are shown in FIG. 7.

UaD goes high at time t1, which is just before the end of a GRO cycle (i.e., before N15 goes high at time t2). Ideally, counter 414 should deactivate immediately when UaD goes high so that counter 414 does not increment BTD_Upper after N15 transitions to high at time t2. Further latch 430 should capture BTD_Upper immediately when UaD goes high. Due to signal delay, however, counter 414 may increment BTD_Upper from M to M+1 at time t3. Depending on signal delay, latch 430 will capture BTD_Upper either at time t4, which is before BTD_Upper is incremented, or at time t5, which is after BTD_Upper is incremented. If latch 430 captures BTD_Upper at time t5, the resulting BTD value will be higher than it should be and thus a substantially inaccurate representation of (A.

Figure 8:
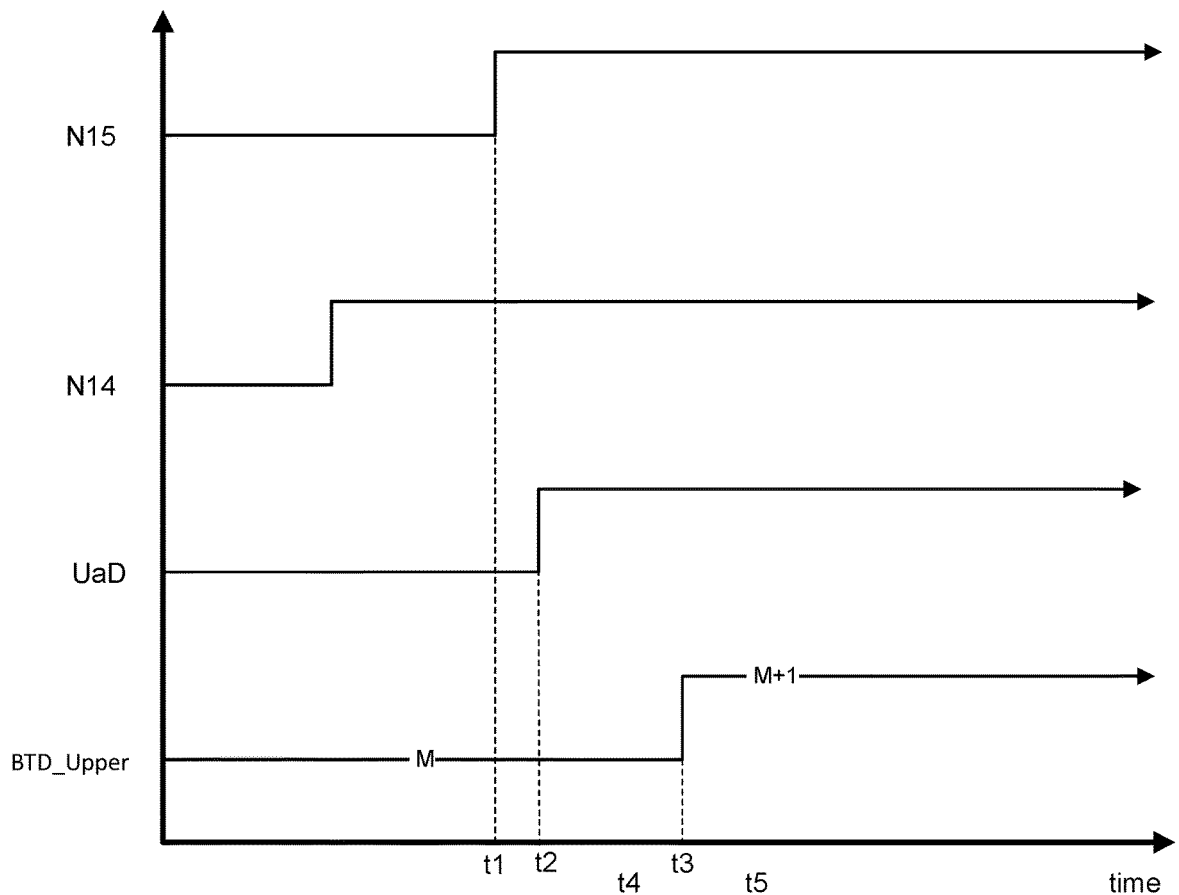
FIG. 8 is another timing diagram illustrating adverse effects of time delay to the operation of the time-to-digital converter shown in FIG. 4.
Figure 8:
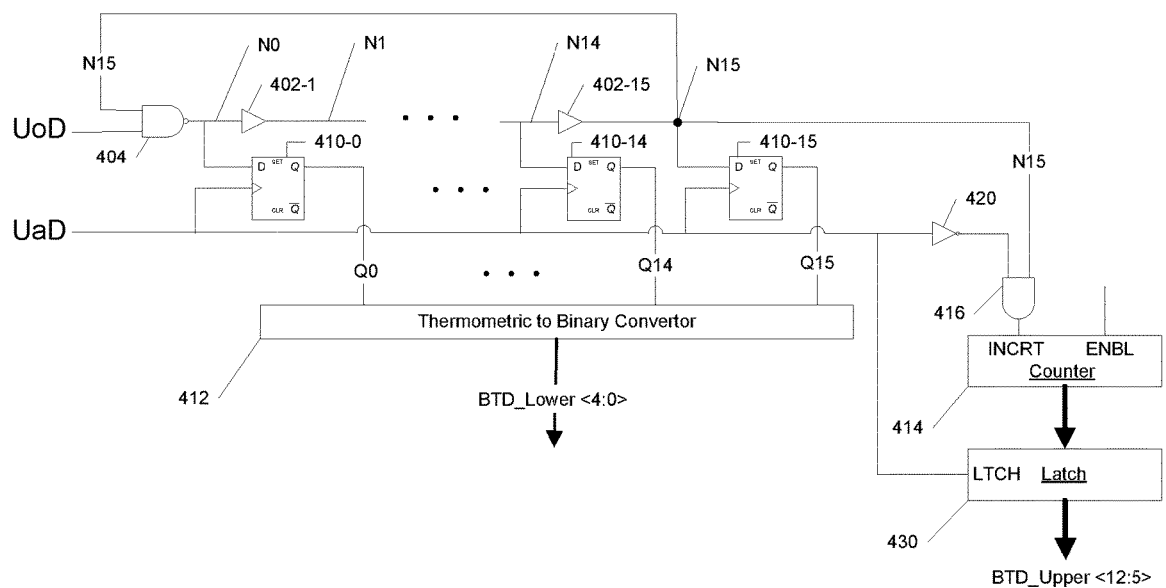

FIG. 8 is a timing chart that illustrates another example in which TDC 116 may generate an inaccurate representation of (A. FIG. 8 shows UaD signal going high at time t2, which is just after the end of a full GRO cycle (i.e., after N15 goes high at time t1). Due to signal delay, counter 414 may increment BTD_Upper from M to M+1 at time t3. Latch 430 will capture BTD_Upper either at time t4, which is before BTD_Upper is incremented, or at time t5, which is after BTD_Upper is incremented. If latch 430 captures BTD_Upper at time t4, the resulting BTD value will be lower than it should be and thus a substantially inaccurate representation of (A.

Figure 9:
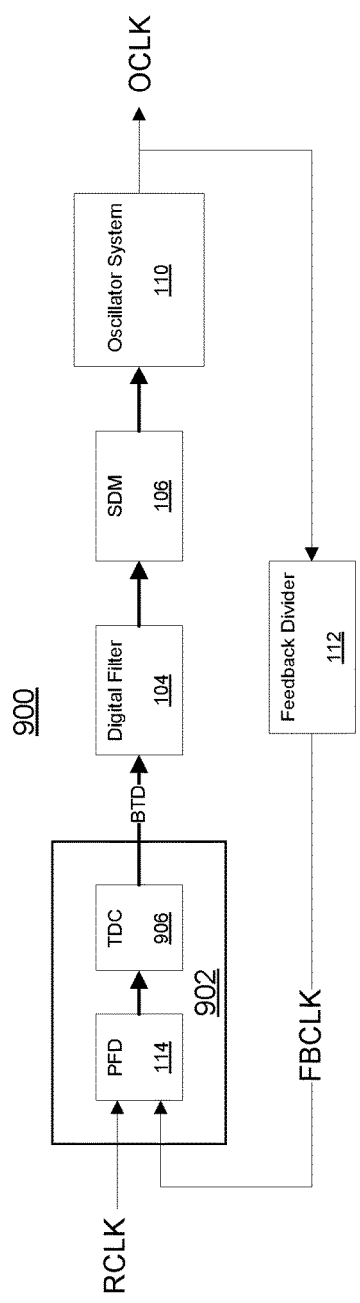
FIG. 9 is a block diagram illustrating a PLL employing a phase-to-digital converter, which in turn employs a time-to-digital converter according to one embodiment of the present disclosure.

The present disclosure provides a TDC that is substantially more accurate when compared to TDC 116. FIG. 9 is a block diagram illustrating an example PLL employing a PDC, which in turn employs a TDC according to one embodiment of the present disclosure. PLL 900 is similar to PLL 100 shown in FIG. 1 in that they both contain digital filter 104, SDM 106, oscillator system 110, and feedback divider 112. PLL 900 includes PDC 902, which in turn includes PFD 114 and TDC 906. Like TDC 116, TDC 906 generates a binary time delay BTD for subsequent processing by digital filter 104. However, TDC 902 generates BTD in a substantially different manner.

Figure 10:
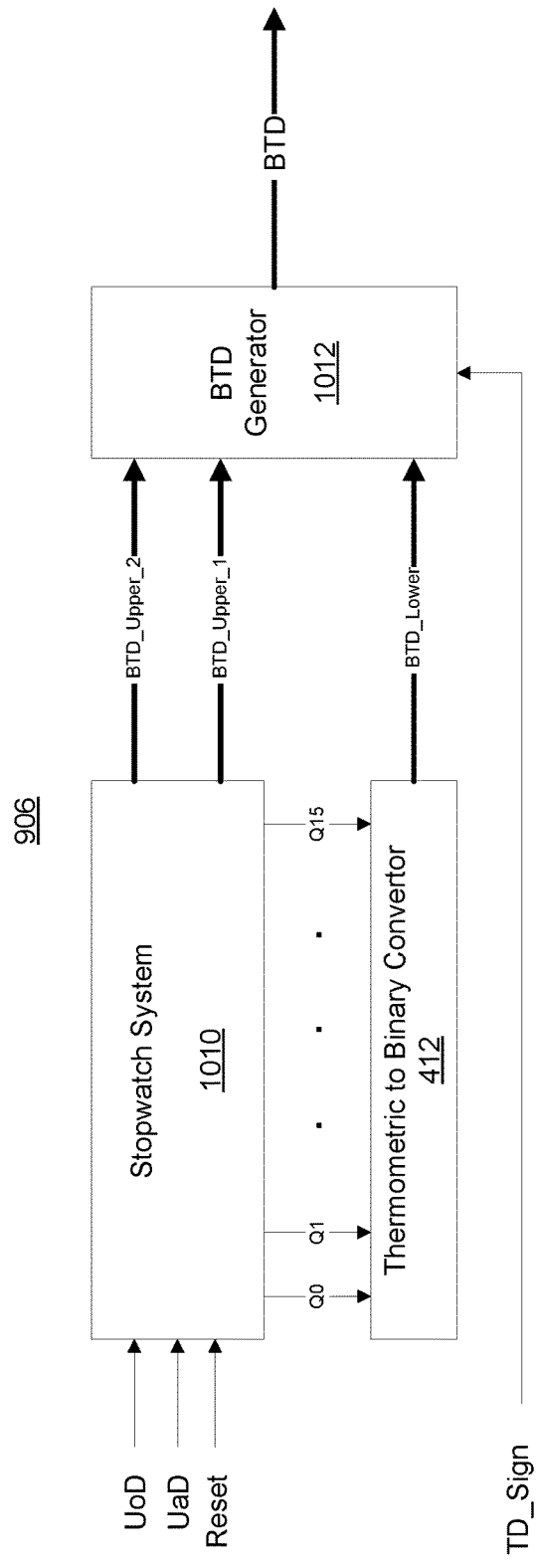
FIG. 10 is a block diagram illustrating an example time-to-digital converter according to one embodiment of the present disclosure.

An example TDC 906 is shown in FIG. 10. TDC 906 includes a stopwatch system 1010 that concurrently provides a pair of BTD_Upper values (BTD_Upper1 and BTD_Upper2), and Q outputs (Q0-Q15). As will be shown in later figures, stopwatch system 1010 includes an oscillator that generates a periodic signal when activated, and separate counters that increment BTD_Upper1 and BTD_Upper2 at different points in the cycle of the periodic signal. At each point in the cycle at least one of the two counter values will be stable or unaffected by signal transmission delay problems like those described above. TDC 906 selects a stable counter value to produce binary time delay BTD.

Figure 11:
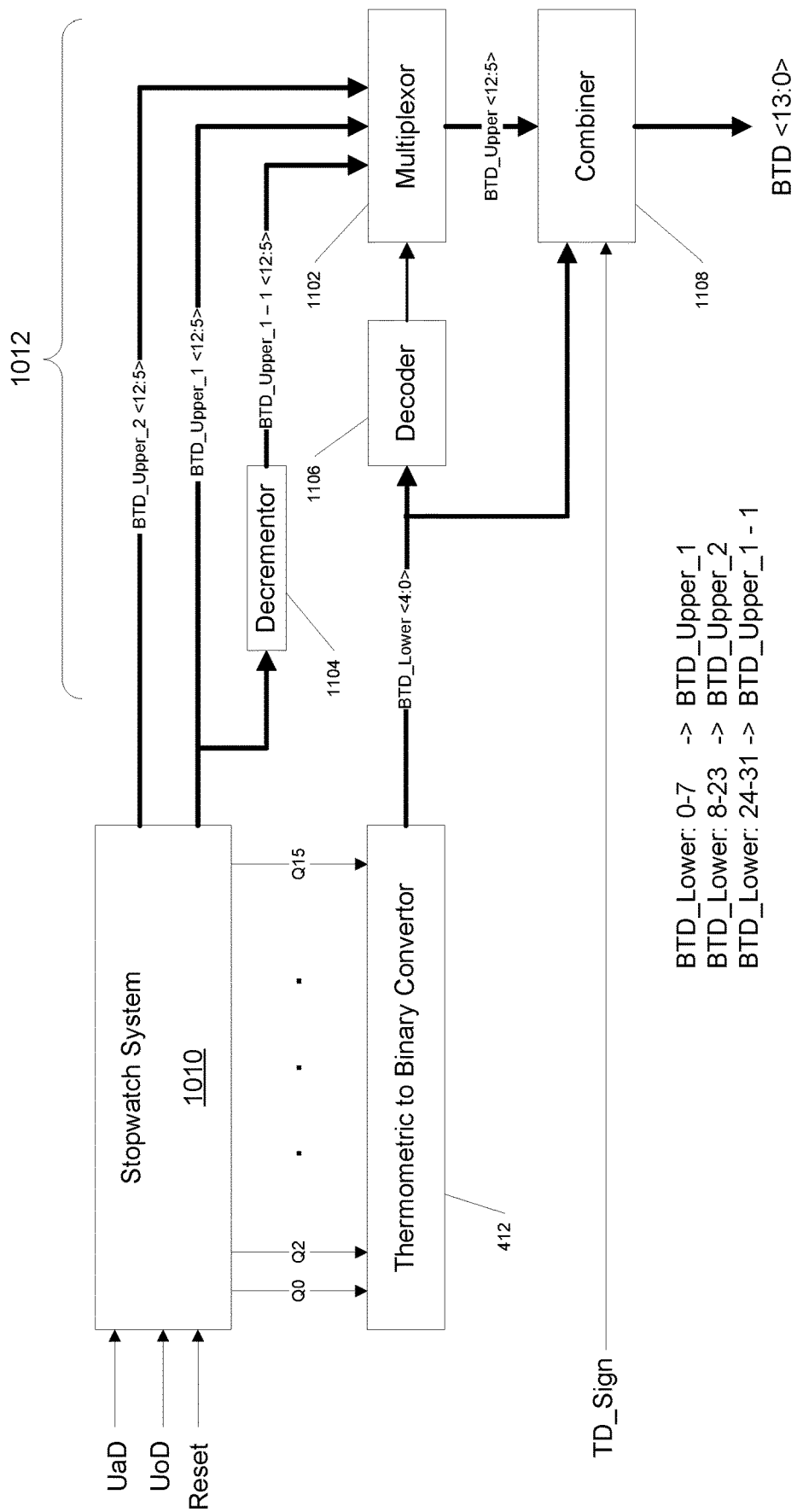
FIG. 11 is a block diagram illustrating an example binary-time-delay generator employed in the time-to-digital converter of FIG. 10.
Figure 12:
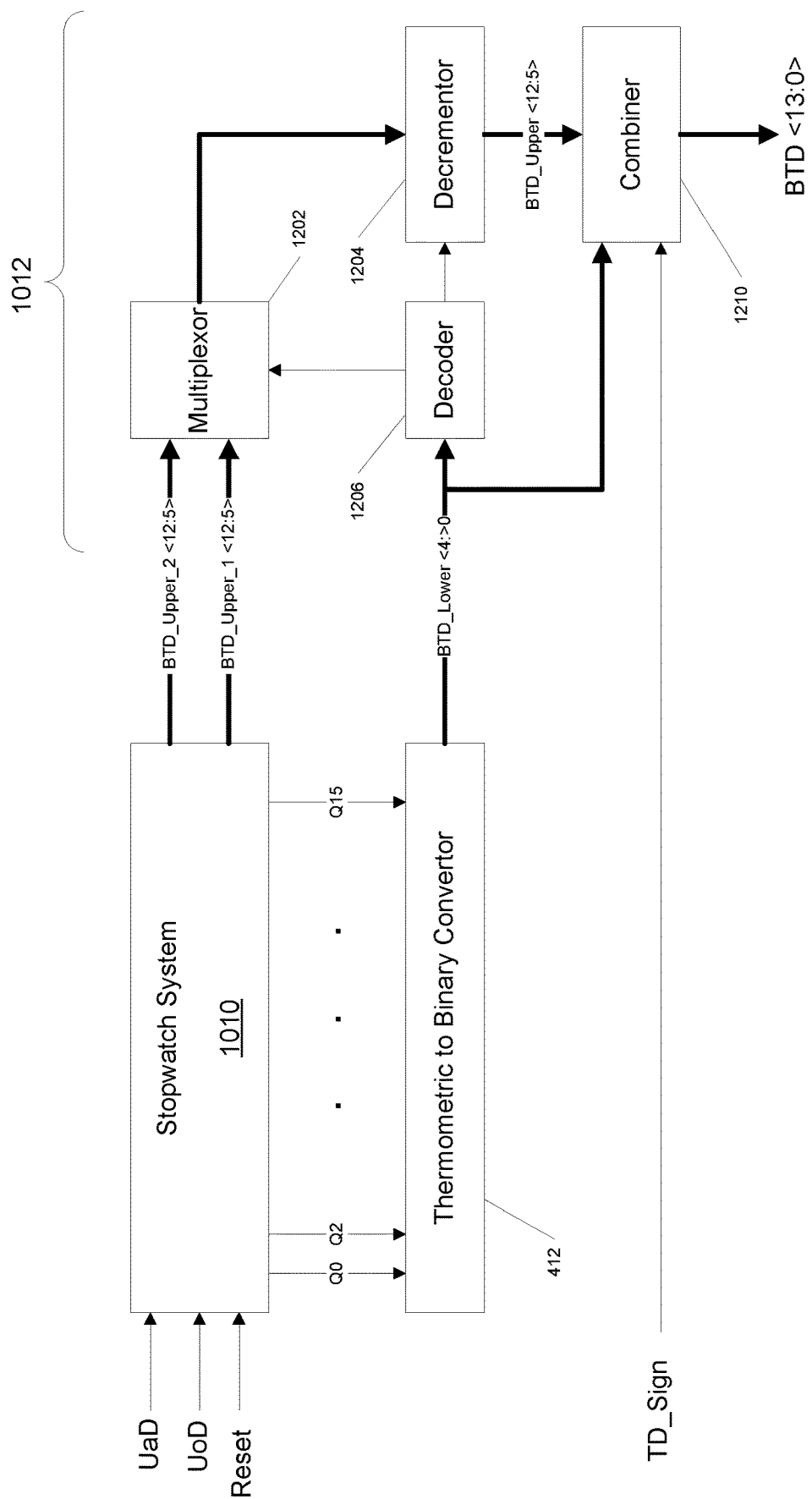
FIG. 12 is a block diagram illustrating another example of a binary-time-delay generator employed in the time-to-digital converter of FIG. 10.

TDC 906 includes TBC 412, which generates BTD_Lower as described above. TDC 906 also includes a BTD generator 1012 that generates BTD based on TD_Sign provided by PFD 114, BTD_Lower provided by TBC 412, and one of BTD_Upper1 and BTD_Upper2 provided by stopwatch system 1010. BTD generator 1012 selects one of BTD_Upper1 and BTD_Upper2 for use in generating BTD based upon BTD_Lower. In one embodiment, BTD generator 1012 generates BTD according to the following conditions:

If BTD_Lower is 0-7, then BTD=TD_Sign‖BTD_Upper1‖BTD_Lower
If BTD_Lower is 8-23, then BTD=TD_Sign‖BTD_Upper2‖BTD_Lower
If BTD_Lower is 24-31, then BTD=TD_Sign‖(BTD_Upper1-1)‖BTD_Lower FIGS. 11 and 12 illustrate alternative embodiments of BTD generator 1012. Each of these figures show stopwatch system 1010 in block diagram form, which generates BTD_Upper1 and BTD_Upper2. TBC 412 generates BTD_Lower based upon the Q0-Q15 outputs of stopwatch system 1010. In FIG. 11, BTD generator 1012 includes a multiplexer 1102 that receives BTD_Upper1 and BTD_Upper2 from stopwatch system 1010. Additionally, multiplexer 1102 receives BTD_Upper1-1 from decrementor 1104. Decoder 1106 provides a select signal that is used by multiplexer 1102 to select one of the three inputs for output to combiner 1108. In the disclosed embodiment decoder 1106 decodes BTD_Lower to generate the select signal, which is set to: a first state if 0≤BTD_Lower≤7; a second state if 8≤BTD_Lower≤23, or; a third state if 24≤BTD_Lower≤31. Multiplexer 1102 outputs: BTD_Upper1 if the select signal is set to the first state; BTD_Upper2 if the select signal is set to the second state, or; BTD_Upper1-1 if the select signal is set to the third state. Combiner 1108 receives and combines TD_Sign, the output of multiplexer 1102, and BTD_Lower to generate BTD.

In FIG. 12 BTD generator 1012 includes multiplexer 1202 that receives BTD_Upper1 and BTD_Upper2 from stopwatch system 1010. Decoder 1206 provides a select signal that is used by multiplexer 1202 to select one of the two inputs for output to decrementor 1204. Decoder 1206 decodes BTD_Lower to generate the select signal, which is set to: a first state if 0≤BTD_Lower≤7 or if 24≤BTD_Lower≤31; a second state if 8≤BTD_Lower≤23. Multiplexer 1202 outputs: BTD_Upper1 if the select signal is set to the first state, or; BTD_Upper2 if the select signal is set to the second state. Decoder 1206 generates a second signal based upon BTD_Lower, and this second signal is provided to decrementor 1204. Decrementor 1204 may or may not decrement the output of multiplexor 1202. When the second signal is asserted, decrementor 1204 decrements the value provided by multiplexer 1204. Otherwise, decrementor 1204 passes the value it receives from multiplexer 1202 to combiner 1210 without modification. In one embodiment, the second signal is asserted only when 24≤BTD_Lower≤31. Combiner 1210 receives and combines TD_Sign, the output of decrementor 1204, and BTD_Lower to generate BTD.

Figure 13:
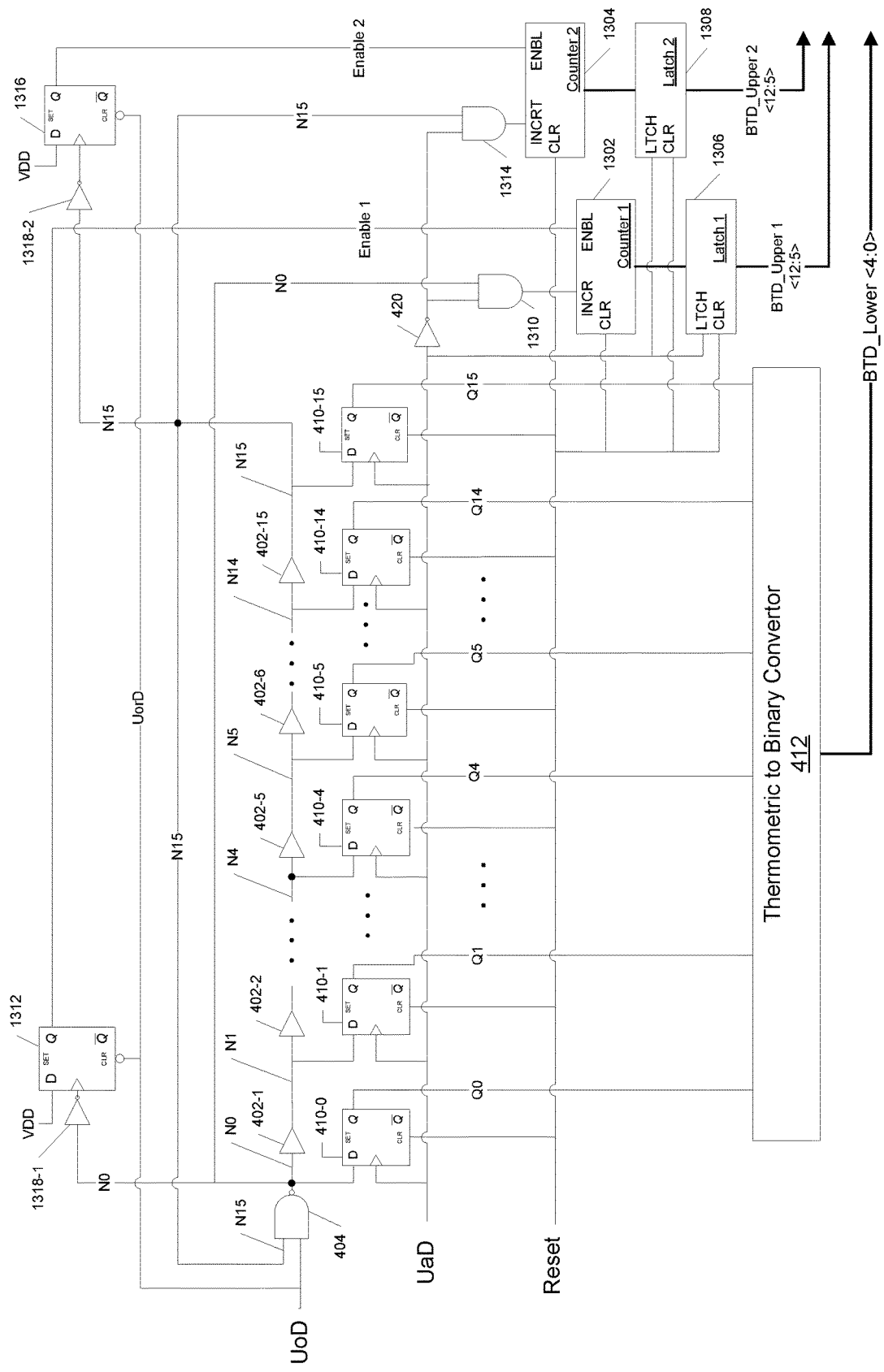
FIG. 13 is a schematic diagram of an example stopwatch system employed in the time-to-digital converter of FIG. 11.

FIG. 13 illustrates relevant aspects of stopwatch system 1010, which includes many of the components shown within FIG. 4. For example, stopwatch system 1010 includes the GRO of FIG. 4, which in turn includes fifteen non-inverting buffers 402 connected in a ring via NAND gate 404, which in turn receives the output of buffer 402-15 and UoD from the PFD 114 (not shown in FIG. 13). When the GRO is activated by UoD, the GRO repeats a cycle in which each of nodes N0-N15 oscillates between high and low values. FIG.

14 illustrates the states of nodes N0-N15 as the GRO undergoes a complete GRO cycle. Each full GRO cycle consists of a first half cycle followed by a second half cycle.

Figure 14:
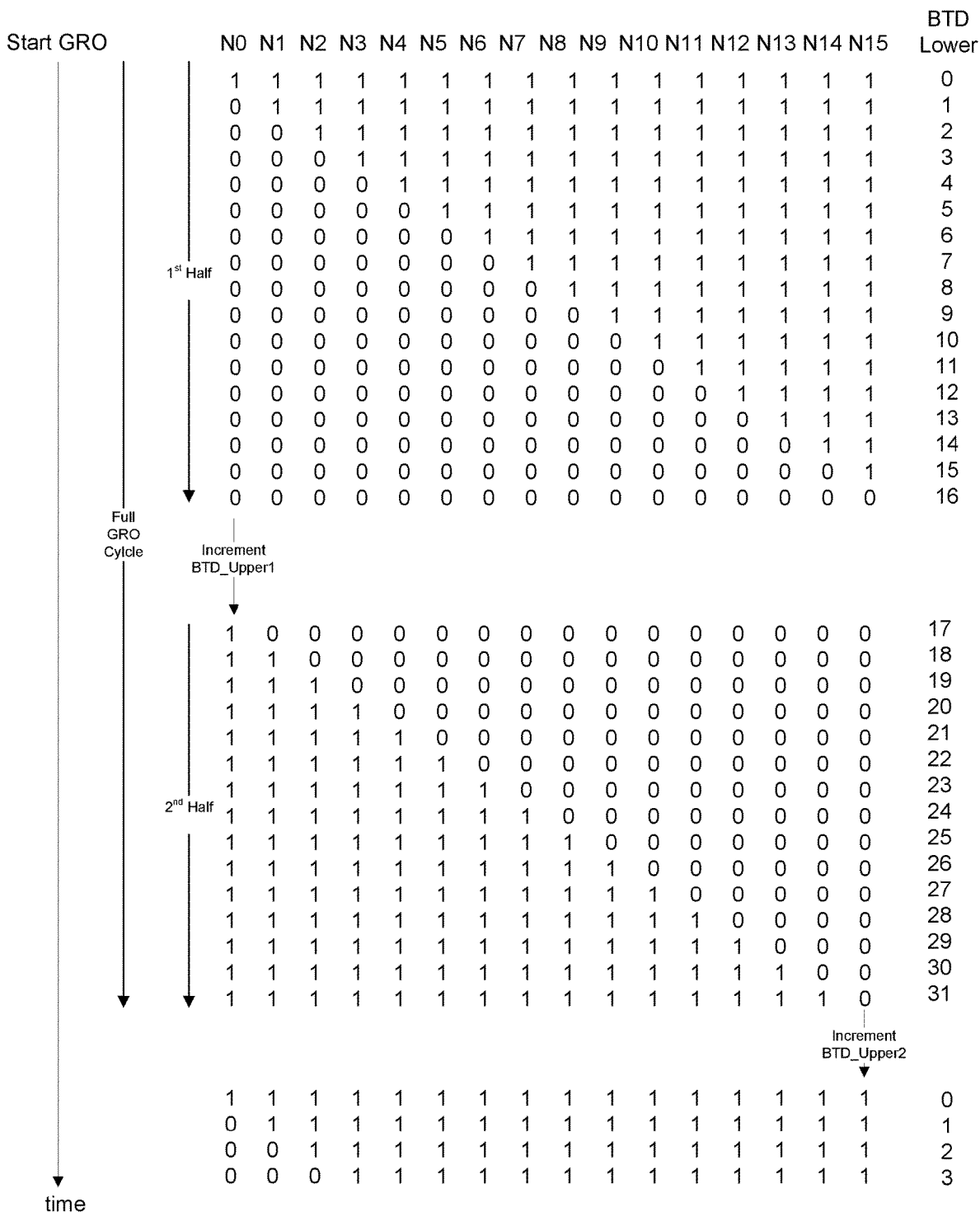
FIG. 14 illustrates the states of nodes of the oscillator shown in FIG. 13 during a cycle thereof.

With continuing reference to FIGS. 13 and 14, stopwatch system 1010 includes first and second counters 1302 and 1304. Each of the counters will be enabled soon after the GRO is activated. In the example embodiment shown, first counter 1302, when enabled, will increment its counter value BTD_Upper1 at the end of each first half cycle, and second counter 1304, when enabled, will increment its counter value BTD_Upper2 at the end of each second half cycle. It should be noted that counters 1302 and 1304 can increment their respective counter values at different points in the GRO cycle in alternative embodiments.

Counter 1302 includes several inputs including INCRT, ENBL and CLR, which receive the output signal of AND gate 1310, the Enable1 output signal of flip-flop 1312, and the Reset signal, respectively. The clock input of flip-flop 1312 receives the output of inverter 1318-1. Counter 1302 resets its counter value BTD_Upper1 to zero each time the Reset signal goes high. Counter 1302 is enabled when the Enable1 output of flip-flop 1312 goes high, which occurs the first time node N0 goes low. AND gate 1310 receives the output NAND gate 404 and the output of inverter 420, which in turn receives UaD. When enabled and while UaD is low, counter 1302 increments BTD_Upper1 each time the output N0 of NAND gate 404 transitions from low to high, which occurs at the end of each first half cycle as shown in FIG. 14.

Counter 1304 includes the same inputs as counter 1302. INCRT, ENBL and CLR, receive the output signal of AND gate 1314, the Enable2 output signal of flip-flop 1316, and the Reset signal, respectively. The clock input of flip-flop 1316 receives the output of inverter 1318-2. Counter 1304 resets its counter value BTD_Upper2 to zero each time Reset is asserted. Counter 1304 is enabled when Enable2 goes high, which occurs the first time when node N15 goes low. Counter 1304 is enabled during the initial first half cycle of the GRO cycle. AND gate 1314 receives the output buffer 402-15 and the output of inverter 420, which in turn receives UaD. When enabled and while UaD is low, counter 1304 increments its counter value BTD_Upper2 each time the output N15 of buffer 402-15 transitions from low to high, which occurs at the end of each GRO cycle as shown in FIG. 14. Since N0 transitions to high before N15 transitions to high, counter 1302 increments before counter 1304 during each GRO cycle. Depending on when the GRO is deactivated, counter 1304 may not increment after counter 1302 increments. While counters 1302 and 1304 increment when N0 and N15 transition, they can increment when different nodes transition in alternative embodiments. For example, inputs to AND gates 1310 and 1314 can be connected to nodes N1 and N14, respectively, which means counters 1302 and 1304 would increment with transitions at nodes N1 and N14, respectively.

Stopwatch system 1010 includes flip-flops 410-0-410-15, which capture the voltage levels at nodes N0-N15, respectively, when UaD transitions from low to high (i.e., when in the GRO is deactivated). The Q outputs of flip-flops 410-0-410-15 are provided as inputs to thermometric-to-binary converter (TBC) 412 for translation into BTD_Lower.

Stopwatch system 1010 also includes a pair of latches circuits 1306 and 1308, which receive the BTD_Upper1 and BTD_Upper2 values, respectively from counters 1302 and 1304, respectively. Counter latch 1306 includes a clear input CLR that receives Reset, and a latch input LTCH that receives UaD. Counter latch 1306 latches or captures the value of BTD_Upper1 when the GRO is deactivated (i.e., when UaD transitions from low to high). Counter latch 1308 includes a clear input CLR that receives Reset and a latch input LTCH that receives BTD_Upper2. Counter latch 1308 captures the value of BTD_Upper2 when the GRO is deactivated. Both latches 1306 and 1308 clear their captured values when Reset is asserted high.

Figure 15:
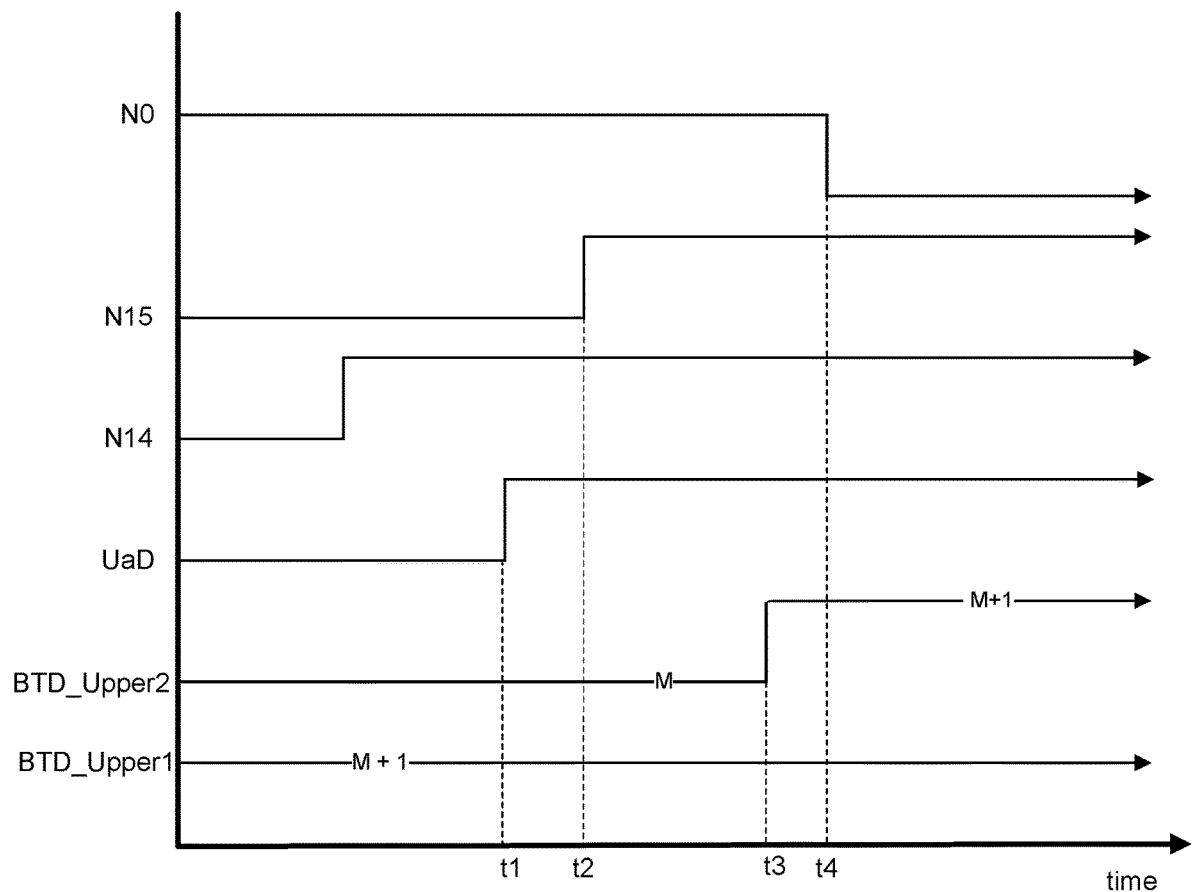
FIG. 15 is a timing diagram illustrating example operational aspects of the present disclosure.

The accuracy of counter 1302 or 1304 may be susceptible to signal delay issues at various points in the GRO cycle. However, the accuracy of both will not be susceptible at the same time. In other words, at least one of BTD_Upper1 or BTD_Upper2 will be accurate or stable at all times during the GRO cycle. Based on the point in the cycle at which the GRO is deactivated, TDC 906 will select the stable value (i.e., BTD_Upper1 or BTD_Upper2) for subsequent use in generating BTD. Because BTD is generated with a stable BTD_Upper1 or BTD_Upper2, the BTD generated by TDC 906 is substantially insensitive to the signal delay issues described with reference to FIGS. 7 and 8. In other words, BTD generator 1012 will generate an accurate BTD representation of phase delay (DA, regardless of the point during the full GRO cycle at which UaD transitions to high. To illustrate, FIG. 15 is a diagram similar to that shown within FIG. 7 and shows the levels of nodes N0, N14, and N15 near the end of a GRO cycle (i.e., when N15 transitions to high). With continuing reference to FIGS. 10-14, UaD goes high at time t1, which is between the times at which nodes N14 and N15 go high. One of ordinary skill understands that M, not M+1, should be used to generate BTD since UaD goes high before the completion of the full GRO cycle. Due to signal delay BTD_Upper2 increments to M+1 at time t3, which is shortly after t2, the time at which N15 goes high. BTD_Upper1 will not increment between times t1 and t4. Latches 1306 and 1308 will capture BTD_Upper1 and BTD_Upper2, respectively, in response to the assertion of UaD. Latch 1308 will capture either BTD_Upper2=M or BTD_Upper2=M+1 depending upon whether latch 1308 completes its latching operation before or after BTD_Upper2 increments to M+1. Due to the uncertainty of when latch 1308 captures BTD_Upper2, the value captured by latch 1308 should not be used to generate BTD. However, latch 1306 will capture BTD_Upper1=M+1 regardless of whether latch 1306 completes its operation before or after time t3. The value for BTD_Lower is most probably 30 or 31, and as a result BTD generator 1012 selects BTD_Upper1-1=M, for use in generating BTD. The resulting BTD will be a substantially accurate representation of (DA.

Figure 16:
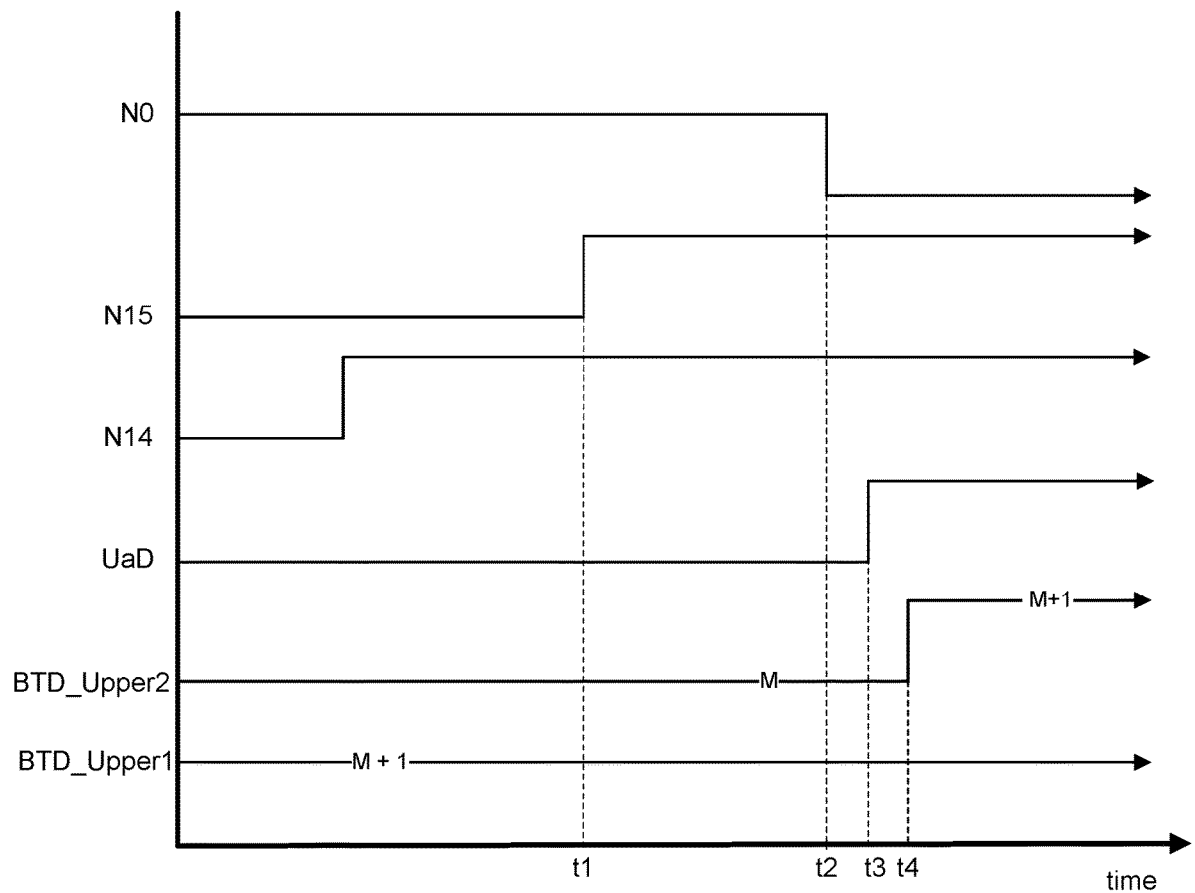
FIG. 16 is a timing diagram illustrating example operational aspects of the present disclosure.

FIG. 16 shows another example in which an unstable value is avoided when generating BTD. In FIG. 16 BTD_Upper2 increments to M+1 at t4, which occurs after N15 transitions to high at t1 and after N0 transitions to low at t2. BTW_Lower is properly 0 after UaD transitions to high at time t3. BTD_Upper2 is slow to increment due to signal delay. As a result, BTD_Upper2 is unstable just after UaD transitions to high (i.e., deactivation of the GRO). BTD_Upper2 should not be used to generate BTD. Fortunately, BRD_Lower1 is stable after time t3. The value for BTD_Lower is most probably 0 or 2, and as a result BTD generator 1012 selects BTD_Upper1=M+1, for use in generating BTD. The resulting BTD will be a substantially accurate representation of ΦΔ.

The following are various embodiments of the present disclosure. In one embodiment, an apparatus includes a phase to digital converter (PDC) configured to generate a digital output that represents a phase difference between first and second clocks. The PDC includes a gated ring oscillator (GRO), which includes N signal delay elements coupled together in a ring via a logic gate, wherein a 1st signal delay element of the ring comprises an input coupled to an output of the logic gate, and wherein a Nth signal delay element of the ring comprises an output coupled to a first input of the logic gate. The apparatus also includes a convertor is coupled to the GRO and configured to generate low order bits of the digital output based on outputs of the logic gate and the N signal delay elements. The apparatus also includes a first counter includes an input coupled to an output of one of the N signal delay elements or the logic gate, wherein the first counter is configured to generate a first digital counter value. The apparatus also includes a second counter includes an input coupled to an output of another one of the N signal delay elements or the logic gate, wherein the second counter is configured to generate a second digital counter value. The PDC generates the digital output signal based on the low order bits and one of the first and second digital counter values. The PDC may further include a phase frequency detector (PFD), which includes a first output coupled to a second input of the logic gate, wherein the PFD is configured to start the GRO with a first edge of the first clock, and wherein the PFD is configured to stop the GRO with a first edge of the second clock. The input of the first counter may be coupled to the output of the logic gate, and the input of the second counter may be coupled to the output of the Nth signal delay element. The PDC may further include a multiplexor for selecting the first or second digital counter value based on the low order bits, wherein the PDC generates the digital output based on the first or second digital counter value selected by the multiplexor. The multiplexor may select the first digital counter value when the lower order bits represent a value that is contained in a range of values, and the multiplexor may select the second digital counter value when the lower order bits represent a value that is not contained in the range of values. The PDC may further include a combinational arithmetic circuit that decrements the first digital counter when selected by the multiplexor, and when the lower order bits represent a value that is contained in a second range of values, wherein the first and second range of values are non-overlapping. Each of the N signal delay elements may be a non-inverting buffer. The apparatus may further include a controlled oscillator configured to generate an output clock with a frequency that depends on the digital output of the PDC, and a feedback divider configured to generate the second clock based on the system clock.

In another embodiment, an apparatus includes a gated ring oscillator (GRO), wherein the GRO includes N signal delay elements coupled together in a ring via a logic gate, wherein a 1st signal delay element of the ring includes an input coupled to an output of the logic gate, and wherein a Nth delay element of the ring comprises an output coupled to a first input of the logic gate. The apparatus also includes a GRO controller, wherein the GRO controller comprises a first output coupled to a second input of the logic gate, wherein the GRO controller is configured to activate the GRO in response to a first signal transitioning between first and second states, and wherein the GRO controller is configured to deactivate the GRO in response to a second signal transitioning between the first and second states. The apparatus also includes N+1 latches for latching respective outputs of the logic gate and the N signal delay elements in response to GRO controller deactivating the GRO. The apparatus also includes a first counter configured to increment a first counter value in response to an output of the one of the N+1 signal delay elements or the logic gate transitioning from the first state to the second state. The apparatus also includes a second counter configured to increment a second counter value in response to an output of another one of the N+1 signal delay elements or the logic gate transitioning from the first state to the second state. The apparatus also includes a circuit for generating a digital value that is proportional to a time difference between the activation and deactivation of the GRO, wherein the circuit generates the digital value based on outputs of the N+1 latches and one of the first and second counter values. The outputs of each of the N signal delay elements and the logic gate may oscillate between the first and second states while the gate GRO is activated. The input of the first counter may coupled to the output of the logic gate, and the input of the second counter may be coupled to the output of the Nth signal delay element. The apparatus may further include a multiplexor for selecting the first or second digital counter value based on the low order bits, wherein the PDC generates the digital output based on the first or second counter value selected by the multiplexor. The multiplexor may select the first counter value when the lower order bits represent a value that is contained in a range of values, and wherein the multiplexor may select the second counter value when the lower order bits represent a value that is not contained in the range of values. The apparatus may further include a combinational arithmetic circuit that decrements the first counter when selected by the multiplexor, and when the lower order bits represent a value that is contained in a second range of values, wherein the first and second range of values are non-overlapping.

In still another embodiment, an apparatus includes an oscillator that generates a periodic signal at an output when activated. The apparatus also includes first counter and second counters that increment first and second counter values, respectively, during each cycle of the periodic signal. The apparatus also includes a controller, wherein the controller is configured to activate the oscillator in response to a first signal transitioning between first and second states, and wherein the controller is configured to deactivate the oscillator in response to a second signal transitioning between the first and second states. The apparatus also includes a circuit for generating a first digital value that is proportional to a point in time in a cycle of the periodic signal when the second signal transitions between first and second states. The apparatus also includes a multiplexor for selecting the first counter value or the second counter value based on the first digital value. The apparatus also includes a circuit for generating a second digital value that represents a time difference between a time when the first signal transitions between first and second states and a point in time when the second signal transitions between first and second states, wherein the circuit generates the second digital signal based on the first digital signal and the first or second counter value selected by the multiplexor. The first counter may increment the first counter value before the second counter increments the second counter value. The first counter may increment the first counter value at a first point in time from the beginning of each cycle of the periodic signal, and wherein the second counter may increment the second counter value at a second point in time from the beginning of each cycle of the periodic signal. The oscillator may include N signal delay elements coupled together in a ring via a logic gate, wherein a 1st signal delay element of the ring comprises an input coupled to an output of the logic gate, and wherein a Nth delay element of the ring comprises an output coupled to a first input of the logic gate, the first counter may include an input coupled to an output of one of the N signal delay elements or the logic gate, and the second counter may include an input coupled to an output of another one of the N signal delay elements or the logic gate. The input of the first counter may be coupled to the output of the logic gate, and the input of the second counter may be coupled to the output of the Nth signal delay element. The multiplexor may select the first counter value when the first digital value is contained in a range of values, and wherein the multiplexor may select the second counter value when the first digital value is not contained in the range of values.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An apparatus comprising:
a phase to digital converter (PDC) configured to generate a digital output that represents a phase difference between first and second clocks, the PDC comprising:
a gated ring oscillator (GRO), wherein the GRO comprises N signal delay elements coupled together in a ring via a logic gate, wherein a $1^{st}$ signal delay element of the ring comprises an input coupled to an output of the logic gate, and wherein a $N^{th}$ signal delay element of the ring comprises an output coupled to a first input of the logic gate;
a convertor coupled to the GRO and configured to generate low order bits of the digital output based on outputs of the logic gate and the N signal delay elements;
a first counter comprising an input coupled to an output of the logic gate, wherein the first counter is configured to generate a first digital counter value;
a second counter comprising an input coupled to an output of the $N^{th}$ signal delay element, wherein the second counter is configured to generate a second digital counter value;
wherein the PDC generates the digital output signal based on the low order bits and one of the first and second digital counter values.

2. The apparatus of claim 1 wherein the PDC further comprises a phase frequency detector (PFD) comprising a first output coupled to a second input of the logic gate, wherein the PFD is configured to start the GRO with a first edge of the first clock, and wherein the PFD is configured to stop the GRO with a first edge of the second clock.

3. The apparatus of claim 1 wherein each of the N signal delay elements is a non-inverting buffer.

4. The apparatus of claim 1 further comprising:
a controlled oscillator configured to generate an output clock with a frequency that depends on the digital output of the PDC;
a feedback divider configured to generate the second clock based on the system clock.

5. An apparatus comprising:
a phase to digital converter (PDC) configured to generate a digital output that represents a phase difference between first and second clocks, the PDC comprising:
a gated ring oscillator (GRO), wherein the GRO comprises N signal delay elements coupled together in a ring via a logic gate, wherein a $1^{st}$ signal delay element of the ring comprises an input coupled to an output of the logic gate, and wherein a $N^{th}$ signal delay element of the ring comprises an output coupled to a first input of the logic gate;
a convertor coupled to the GRO and configured to generate low order bits of the digital output based on outputs of the logic gate and the N signal delay elements;
a first counter comprising an input coupled to an output of one of the N signal delay elements or the logic gate, wherein the first counter is configured to generate a first digital counter value;
a second counter comprising an input coupled to an output of another one of the N signal delay elements or the logic gate, wherein the second counter is configured to generate a second digital counter value;
wherein the PDC generates the digital output signal based on the low order bits and one of the first and second digital counter values,
wherein the PDC further comprises a multiplexor for selecting the first or second digital counter value based on the low order bits, wherein the PDC generates the digital output based on the first or second digital counter value selected by the multiplexor, wherein the multiplexor selects the first digital counter value when the lower order bits represent a value that is contained in a range of values, and wherein the multiplexor selects the second digital counter value when the lower order bits represent a value that is not contained in the range of values, and
wherein the PDC further comprises a combinational arithmetic circuit that decrements the first digital counter when selected by the multiplexor and when the lower order bits represent a value that is contained in a second range of values, wherein the first and second range of values are non-overlapping.

6. The apparatus of claim 5 wherein the PDC further comprises a phase frequency detector (PFD) comprising a first output coupled to a second input of the logic gate, wherein the PFD is configured to start the GRO with a first edge of the first clock, and wherein the PFD is configured to stop the GRO with a first edge of the second clock.

7. The apparatus of claim 5 wherein each of the N signal delay elements is a non-inverting buffer.

8. The apparatus of claim 5 further comprising:
a controlled oscillator configured to generate an output clock with a frequency that depends on the digital output of the PDC;
a feedback divider configured to generate the second clock based on the system clock.

9. An apparatus comprising:
a gated ring oscillator (GRO), wherein the GRO comprises N signal delay elements coupled together in a ring via a logic gate, wherein a $1^{st}$ signal delay element of the ring comprises an input coupled to an output of the logic gate, and wherein a $N^{th}$ delay element of the ring comprises an output coupled to a first input of the logic gate;
a GRO controller, wherein the GRO controller comprises a first output coupled to a second input of the logic gate, wherein the GRO controller is configured to activate the GRO in response to a first signal transitioning between first and second states, and wherein the GRO controller is configured to deactivate the GRO in response to a second signal transitioning between the first and second states;
N+1 latches for latching respective outputs of the logic gate and the N signal delay elements in response to GRO controller deactivating the GRO;

a first counter configured to increment a first counter value in response to an output of the logic gate transitioning from the first state to the second state;

a second counter configured to increment a second counter value in response to an output of the $N^{th}$ signal delay element or the logic gate transitioning from the first state to the second state;

a circuit for generating a digital value that is proportional to a time difference between the activation and deactivation of the GRO, wherein the circuit generates the digital value based on outputs of the N+1 latches and one of the first and second counter values.

10. The apparatus of claim 9 wherein outputs of each of the N signal delay elements and the logic gate oscillate between the first and second states while the GRO is activated.

11. An apparatus comprising:

a gated ring oscillator (GRO), wherein the GRO comprises N signal delay elements coupled together in a ring via a logic gate, wherein a $1^{st}$ signal delay element of the ring comprises an input coupled to an output of the logic gate, and wherein a $N^{th}$ delay element of the ring comprises an output coupled to a first input of the logic gate;

a GRO controller, wherein the GRO controller comprises a first output coupled to a second input of the logic gate, wherein the GRO controller is configured to activate the GRO in response to a first signal transitioning between first and second states, and wherein the GRO controller is configured to deactivate the GRO in response to a second signal transitioning between the first and second states;

N+1 latches for latching respective outputs of the logic gate and the N signal delay elements in response to GRO controller deactivating the GRO;

a first counter configured to increment a first counter value in response to an output of the one of the N+1 signal delay elements or—the logic gate transitioning from the first state to the second state;

a second counter configured to increment a second counter value in response to an output of another one of the N+1 signal delay elements or the logic gate transitioning from the first state to the second state;

a circuit for generating a digital value that is proportional to a time difference between the activation and deactivation of the GRO, wherein the circuit generates the digital value based on outputs of the N+1 latches and one of the first and second counter values;

a multiplexor for selecting the first or second digital counter value based on the low order bits, wherein the PDC generates the digital output based on the first or second counter value selected by the multiplexor, wherein the multiplexor selects the first counter value when the lower order bits represent a value that is contained in a range of values, and wherein the multiplexor selects the second counter value when the lower order bits represent a value that is not contained in the range of values; and a combination arithmetic circuit that decrements the first counter when selected by the multiplexor, and when the lower order bits represent a value that is contained in a second range of values, wherein the first and second range of values are non-overlapping.

12. The apparatus of claim 11 wherein outputs of each of the N signal delay elements and the logic gate oscillate between the first and second states while the GRO is activated.

13. An apparatus comprising:

an oscillator that generates a periodic signal at an output when activated;

first counter and second counters that increment first and second counter values, respectively, during each cycle of the periodic signal;

a controller, wherein the controller is configured to activate the oscillator in response to a first signal transitioning between first and second states, and wherein the controller is configured to deactivate the oscillator in response to a second signal transitioning between the first and second states;

a circuit for generating a first digital value that is proportional to a point in time in a cycle of the periodic signal when the second signal transitions between first and second states;

a multiplexor for selecting the first counter value or the second counter value based on the first digital value;

a circuit for generating a second digital value that represents a time difference between a time when the first signal transitions between first and second states and a point in time when the second signal transitions between first and second states, wherein the circuit generates the second digital signal based on the first digital signal and the first or second counter value selected by the multiplexor, wherein;

the oscillator comprises N signal delay elements coupled together in a ring via a logic gate, wherein a $1^{st}$ signal delay element of the ring comprises an input coupled to an output of the logic gate, and wherein a $N^{th}$ delay element of the ring comprises an output coupled to a first input of the logic gate;

the first counter comprises an input coupled to an output of the logic gate;

the second counter comprises an input coupled to an output of the $N^{th}$ signal delay element.

14. The apparatus of claim 13 wherein the first counter increments the first counter value before the second counter increments the second counter value.

15. The apparatus of claim 13 wherein the first counter increments the first counter value at a first point in time from the beginning of each cycle of the periodic signal, and wherein the second counter increments the second counter value at a second point in time from the beginning of each cycle of the periodic signal.

16. The apparatus of claim 13 wherein the multiplexor selects the first counter value when the first digital value is contained in a range of values, and wherein the multiplexor selects the second counter value when the first digital value is not contained in the range of values.

17. The apparatus of claim 13 wherein each of the N signal delay elements is a non-inverting buffer.

18. The apparatus of claim 13 wherein outputs of each of the N signal delay elements and the logic gate oscillate between the first and second states while the oscillator is activated.

* * * * *